United States Patent
Kouda (12) United States Patent (10) Patent No.: US 6,359,234 B1
(45) Date of Patent: Mar. 19, 2002

(54) PACKAGE SUBSTRATE FOR MOUNTING SEMICONDUCTOR CHIP WITH LOW IMPEDANCE AND SEMICONDUCTOR DEVICE HAVING THE SAME

(75) Inventor: Tsunenobu Kouda, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/602,064

(22) Filed: Jun. 23, 2000

(30) Foreign Application Priority Data

Jun. 25, 1999 (JP) .......................................... 11-179502

(51) Int. Cl.⁷ ................................................. H05K 1/16
(52) U.S. Cl. ........................ 174/260; 174/255; 174/261; 174/262; 361/760; 361/762; 361/794; 361/783; 257/738
(58) Field of Search ................................ 174/260, 255, 174/261, 262, 52.4; 361/760, 763, 780, 794, 792, 761, 762, 764, 767, 774, 783, 795, 719, 793; 257/698, 737, 738, 700; 333/246, 247, 12, 32, 33, 185

(56) References Cited

U.S. PATENT DOCUMENTS

| | | | | |
|---|---|---|---|---|
| 4,675,789 A | * | 6/1987 | Kuwabara et al. | 361/794 |
| 5,557,502 A | * | 9/1996 | Banerjee et al. | 361/712 |
| 5,583,378 A | * | 12/1996 | Marrs et al. | 257/710 |
| 5,625,166 A | * | 4/1997 | Natarajan | 174/52.4 |
| 5,640,048 A | * | 6/1997 | Selna | 257/738 |
| 5,796,170 A | * | 8/1998 | Marcantonio | 257/786 |
| 5,814,883 A | * | 9/1998 | Sawai et al. | 257/712 |
| 5,831,810 A | * | 11/1998 | Bird et al. | 361/301.1 |
| 5,847,936 A | * | 12/1998 | Forehand et al. | 361/794 |
| 5,923,540 A | * | 7/1999 | Asada et al. | 361/794 |
| 6,153,829 A | * | 11/2000 | Carapella et al. | 174/52.1 |

FOREIGN PATENT DOCUMENTS

| | | |
|---|---|---|
| JP | 64-23598 | 1/1989 |
| JP | 5-109924 | 4/1993 |

* cited by examiner

Primary Examiner—Albert W. Paladini
Assistant Examiner—I B Patel
(74) Attorney, Agent, or Firm—Hayes, Soloway, Hennessey, Grossman & Hage P.C.

(57) ABSTRACT

A package substrate in which a semiconductor chip is placed is disclosed. A through hole land (opposed conductor) connected to a signal wiring is opposite to a fixed electrical potential conductor through an insulator layer. The through hole land is disposed in a wiring layer on the outermost side of wiring layers of the package substrate. The through hole land connected to the signal wiring for input/output of signals at a higher frequency has a larger size. The through hole lands connected to the signal wiring for input/output of signals at a certain frequency and the through hole lands connected to the signal wiring for input/output of signals at a lower frequency than the certain frequency are alternately arranged. The through hole land, the insulator layer and the fixed electrical potential conductor form a capacitor and serve as a stub, thereby reducing impedance of the signal wiring connected thereto.

13 Claims, 4 Drawing Sheets

PACKAGE SUBSTRATE FOR MOUNTING SEMICONDUCTOR CHIP WITH LOW IMPEDANCE AND SEMICONDUCTOR DEVICE HAVING THE SAME

BACKGROUND OF THE INVENTION

1. Field of the Invention

The present invention relates to a package substrate for mounting a semiconductor chip and a semiconductor device including the package substrate.

2. Description of the Related Art

In general, a semiconductor chip is used as a semiconductor device with the chip mounted on a package substrate in consideration of the use environment, the ability of mounting or the like. There are various types of packages in accordance with the size or the number of terminals of the semiconductor chip. In the case of a package with many terminals for example, use is sometimes made of a BGA (Ball Grid Array) type in which terminals are arranged in grid form on the lower surface of a package, an LGA (Land Grid Array) type or the like.

Figure 1:
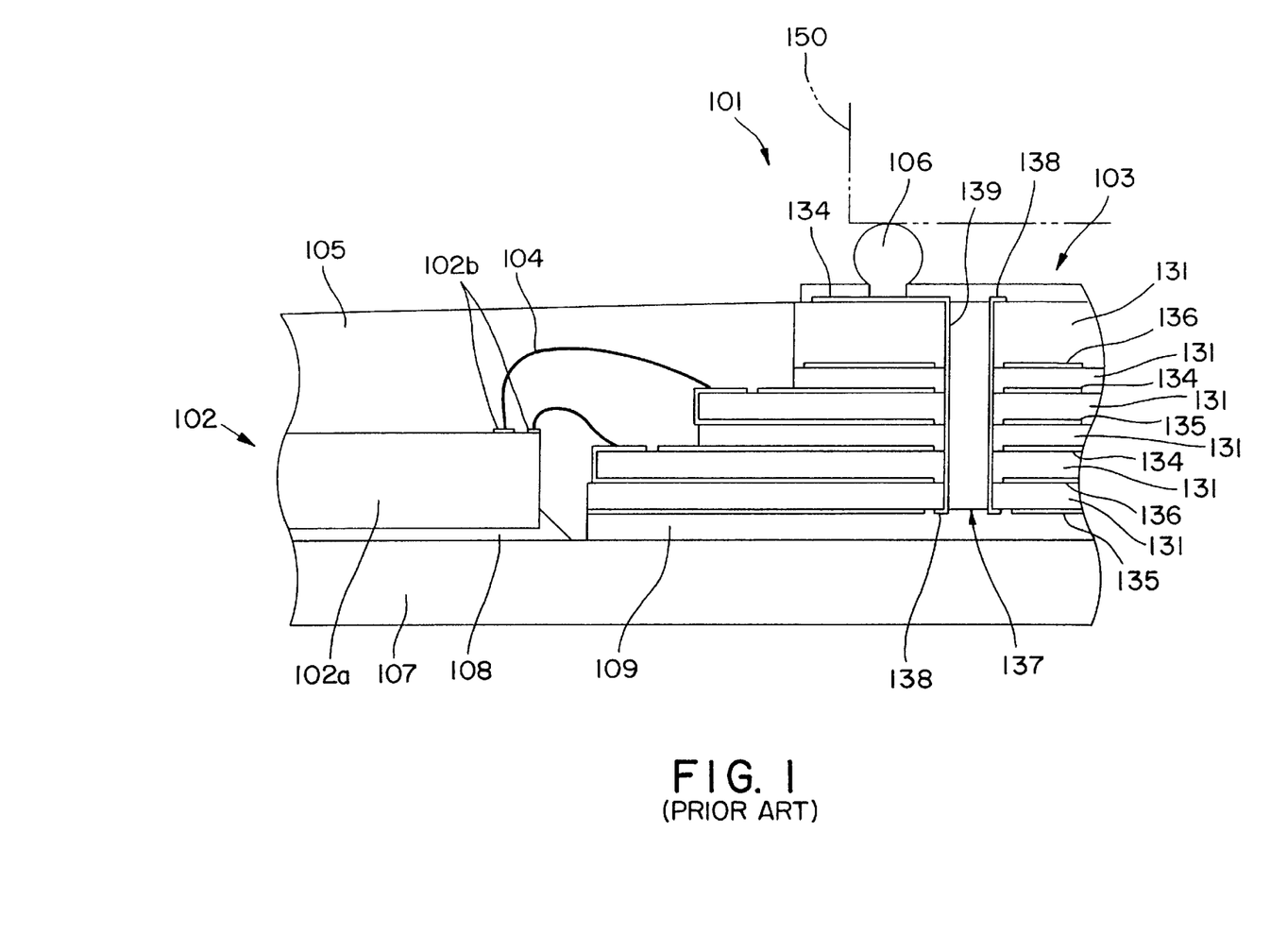
FIG. 1 is a partial sectional view schematically showing the internal structure of a conventional semiconductor device.

With reference to FIG. 1, an example of such a package substrate and semiconductor device is explained. In semiconductor device 101, semiconductor chip 102 having a large number of circuit elements 102a of various types (only one of them is shown in FIG. 1) is mounted on package substrate 103. Package substrate 103 has a rectangular opening formed in its central portion in which semiconductor chip 102 is placed. In this case, package substrate 103 and semiconductor chip 102 are supported by heat spreader 107 disposed on their back. Package substrate 103 and semiconductor chip 102 are fixed to heat spreader 107 with adhesive layers 108 and 109.

Package substrate 103 has a plurality of solder balls 106 formed on its front surface which serve as outer bumps for connection to another circuit device 150. Package substrate 103 has wiring layers on its surface and interior on which any one of signal wiring 134, electric power line 135 and ground line 136 is formed. Signal wiring 134, electric power line 135 and ground line 136 are hereinafter collectively referred to as "wiring 133". Each wiring (signal wiring 134, power line 135 or ground line 136) is connected to any one of solder balls 106. On the other hand, terminal 102b on a surface of semiconductor chip 102 is electrically connected to any one of wirings 134, 135, or 136 through bonding wire 104. Semiconductor chip 102 and bonding wire 104 are protected by resin portion 105.

The use of a large number of terminals 102b in semiconductor chip 102 causes package substrate 103 to be multilayered. Specifically, package substrate 103 includes on its surface and inside, a plurality of wiring layers (seven layers in FIG. 1) with insulator layers 131 sandwiched therebetween. In this case, the connection between different wiring layers is made via through hole wire 139 on the inner wall of through hole 137. Formed on the front and back of package substrate 103 at positions corresponding to through hole 137 are through hole lands 138 for electrical conduction to through hole wire 139. Through hole lands 138 are formed in view of the accuracy of through hole forming steps, and have a required minimum size which is typically slightly larger than the diameter of through hole 137. In a current standard design rule, the arrangement pitch of solder balls 106 is 1.27 mm. The arrangement pitch of the through holes in this semiconductor device 101 is 1.27 mm to accord with that of solder balls 106. Accordingly, an inside diameter Ø of the through hole is 0.3 mm, and an outside diameter Ø of the through hole land is 0.55 mm.

The provision of signal wiring on each of a plurality of adjacent wiring layers may have a mutual effect among the signal wiring, causing signal disturbances. To avoid this, both of the wiring layers adjacent to the wiring layer with signal wiring 134 include electric power line 135 or ground line 136 without fail. Signal wiring 134 is formed in a predetermined pattern such that the length between the pad portion to which wiring 104 is connected and solder ball 106 is as uniform and short as possible over the entire semiconductor device 101. In contrast, electric power line 135 and ground line 136 are formed in a plane or mesh configuration over the entire surfaces of their wiring layers. Such a semiconductor device is disclosed, for example, in Japanese Patent Laid-open No.109924/93 and Japanese Patent Laid-open No.23598/89.

In general, when a plurality of circuits are interconnected, to match the impedance between the respective circuits is needed for preventing reflection of signals and the like. This applies to a semiconductor chip and a package substrate in a semiconductor device. In recent years, a lower impedance is required in the package substrate with improvement in operating frequency of various types of semiconductor devices. Currently, since the access speed to memories is low as compared with the operation speed of processors, the access speed to the memories interferes with the improvement in the processing speed of computers. While various techniques have been developed for providing a faster access speed to the memories, the package substrate having such a fast memory must have an impedance value significantly lower than before. For example, the impedance must be reduced to the order of 28 Ω in a DRDRAM (Direct Rambus Dynamic Random Access Memory) operating at 400 MHz.

For reducing the impedance of the package substrate, it is contemplated to increase the width between wirings. This is, however, undesirable because it invokes a drop in a wiring density. Especially in a package with a large number of pins, a wiring design is extremely difficult. In addition, this method has little effect of reducing the impedance. For example, with a multi-layer substrate using organic interlayer insulator layers with a relative dielectric constant of 4.7, only a 10% reduction in characteristic impedance is obtained even when the width between wirings is increased 50%.

As an alternative to reducing the impedance, it is also contemplated to decrease the interval between the signal wiring layer and the wiring layer at a fixed electrical potential (power layer, ground layer) in the package substrate, i.e., the thickness of the insulator layer. However, an indiscriminate reduction in thickness of the insulator layer makes the dimension (thickness) of the entire semiconductor device different from that of a conventional device. This is not desirable because the dimension of the semiconductor device is standardized to some extent, and a deviation from the standard requires redesign of the other parts. In general, the size, shape or the like of the entire semiconductor device is changed only when significant progress is made in the technology level or contents of the semiconductor device, or the like. Even when it is possible to manufacture a semiconductor chip having the same circuits as before but in a smaller size than before with the advance of its manufacturing technology, the same size and shape as before are often employed for the entire semiconductor device. Therefore, it is required to minimize the possibility that the dimension of the entire semiconductor device is different from a conventional device due to the package substrate.

SUMMARY OF THE INVENTION

It is an object of the present invention to provide a package substrate with a low impedance and a semiconductor device including the same.

To solve the aforementioned problems, the package substrate according to the present invention is mounted on an external device with a semiconductor chip having circuit elements and terminals being placed thereon to connect the circuit elements with the external device. The package substrate comprises a plurality of mounting terminals to be mounted on the external device, a plurality of signal wirings provided corresponding to the mounting terminals, a fixed electric potential conductor, and one or more opposed conductor.

The signal wiring connects the terminals of a semiconductor chip to be mounted to the mounting terminals. The fixed electrical potential conductor is maintained at a constant electrical potential when mounted on the external device. The opposed conductor is connected to any one of the signal wirings and is placed that it is opposite to the fixed electrical potential conductor and maintains insulation from the fixed electrical potential conductor.

According to the configuration, the opposed conductor is opposite to the fixed electrical potential conductor to form a capacitor. The capacitor serves as a stub to reduce the impedance of the signal wiring connected to the opposed conductor.

The greater the capacitance of the capacitor, the more the impedance is decreased for example, for increasing the capacitance, the area of the opposed conductor opposite to the fixed electrical potential conductor may be increased. In this case, if the opposed conductor is placed on the wiring surface disposed on its outermost side, especially on the wiring surface different from the wiring surface on which the mounting terminals are placed, the opposed conductor can be readily increased in size without any hindrance from other wirings or the mounting terminals.

Input and output signals to and from the respective signal wirings do not necessarily have an equal frequency. The signal wiring for input/output of signals at a higher frequency requires a lower impedance. Therefore, if the area of the opposed conductor connected to the signal wiring for input/output of signals at a higher frequency is made larger, the limited area of the package substrate can be effectively used to provide impedance matching.

The alternate arrangement of the opposed conductor connected to the signal wiring for input/output of signals at a certain frequency, i.e., the opposed conductor for which an increased size is desirable, and the opposed conductor connected to the signal wiring for input/output of a signal at a lower frequency than the certain frequency, i.e., the opposed conductor which may have a small size, will increase the former opposed conductor in size with no arrangement of an unnatural manner.

The opposed conductor and the signal wiring may be connected through a through hole wire in a through hole in insulator layers. When the opposed conductor is placed around the through hole with the through hole wiring connected to the opposed conductor, the limited area in which the opposed conductor is placed can be utilized with no waste.

In this case, the opposite conductor may be formed using a so-called through hole land. Since the through holes or the like have a pitch which is standardized to some extent, the respective elements are preferably set in the following sizes.

Specifically, when the through holes have a 1.27 mm pitch, the larger through hole land (opposed conductor) is formed in circular shape with an outside diameter of 0.55 mm or more, and the smaller through hole land (opposed conductor) is formed in circular shape with an outside diameter of 0.55 mm or less. This configuration allows the reduction of the impedance without impairment of the insulation between the respective through hole lands.

In addition, the impedance can be further reduced by reducing the internal diameter of the through hole (0.2 mm or less, for example) to increase the area of opposite portion of the opposed conductor and the fixed electrical potential conductor.

The magnitude of the capacitance depends not on the size of the through hole land (opposed conductor) but on the area of opposite portion of the through hole land (opposed conductor) and the fixed electrical potential conductor. Therefore, even when the through hole and (opposed conductor) is made larger, capacitance is not increased if it is not opposite to the fixed electrical potential conductor. It is thus desirable that the fixed electrical potential conductor is formed in a plane configuration extending substantially over the entire surface of the wiring surface having the fixed electrical potential conductor. This enables the entire through hole land (opposed conductor) to be utilized for the capacitor. Additionally, the size, shape and arrangement of the through hole land (opposed conductor) can be changed as required without concern for the presence or absence of the fixed electrical potential conductor (whether the through hole land (opposed conductor) is opposite to the fixed electrical potential conductor).

The capacitance of the capacitor can also be increased by making a dielectric constant of the insulator layer higher other than the aforementioned method. However, since such a higher dielectric constant of the insulator layer makes it difficult to increase the wiring density, the insulator layer provided between the opposed conductor and the fixed electrical potential conductor is formed to have the highest dielectric constant of the insulator layers and the other insulator layers are formed to have a dielectric constant lower than that (preferably, equal to or lower than the conventional dielectric constant). Thus, a lower impedance can be obtained without reducing the wiring density of the signal wirings and the like.

The capacitance of the capacitor can be increased, other than the aforementioned methods, by reducing in thickness the insulator layer provided between the opposed conductor and the fixed electrical potential conductor. The insulator layer may have a thickness of 150 $\mu$m or less, for example.

As described above, the present invention makes it possible to realize the package substrate for a semiconductor device and the semiconductor device having a low impedance and capable of adapting to signals at a higher frequency, and the semiconductor device.

The above and other objects, features and advantages of the present invention will become apparent from the following description with reference to the accompanying drawings which illustrate examples of the present invention.

DESCRIPTION OF THE PREFERRED EMBODIMENT

Figure 2A:
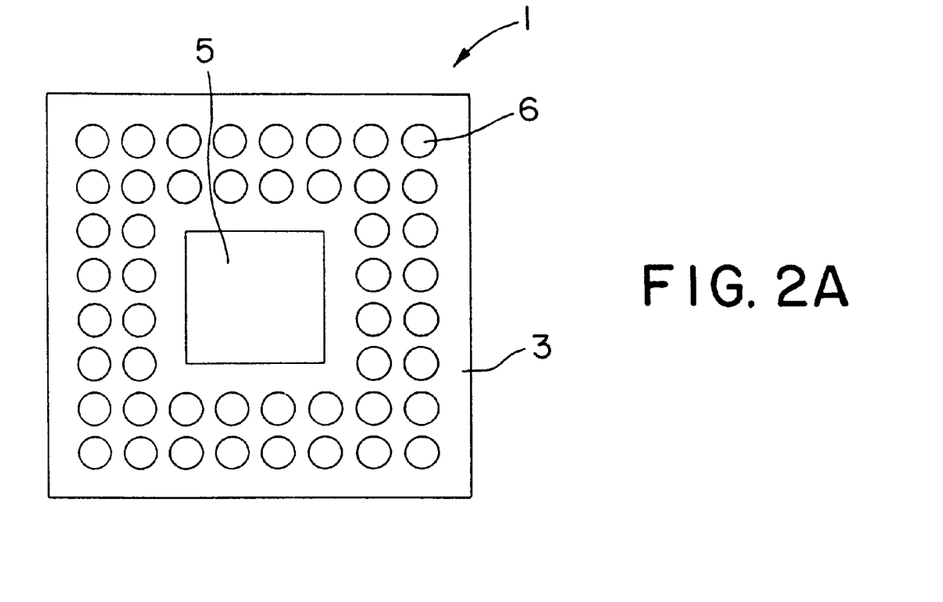
FIG. 2A is a plan view showing an appearance of a semiconductor device of a first embodiment according to the present invention.
Figure 2B:
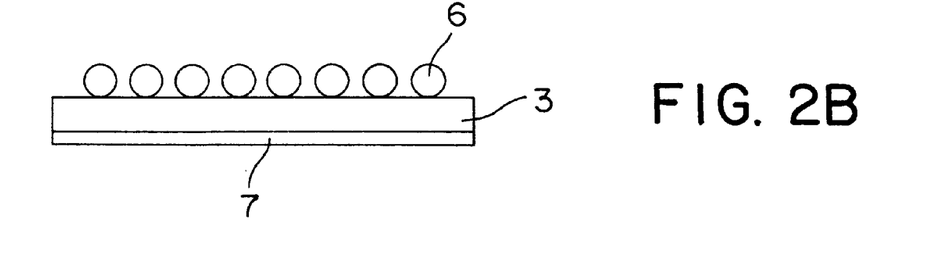
FIG. 2B is a front view of the semiconductor device according to the first embodiment.
Figure 2C:
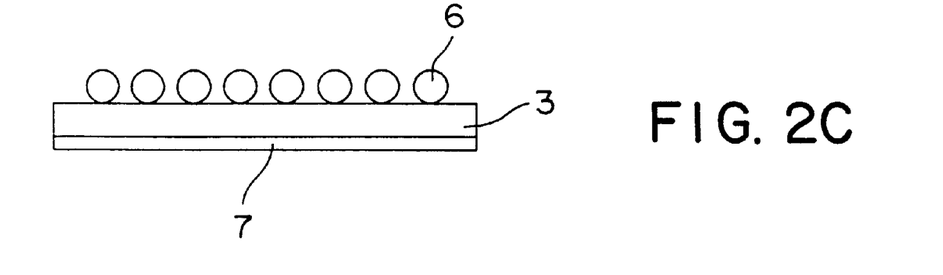
FIG. 2C is a side view of the semiconductor device according to the first embodiment.
Figure 3:
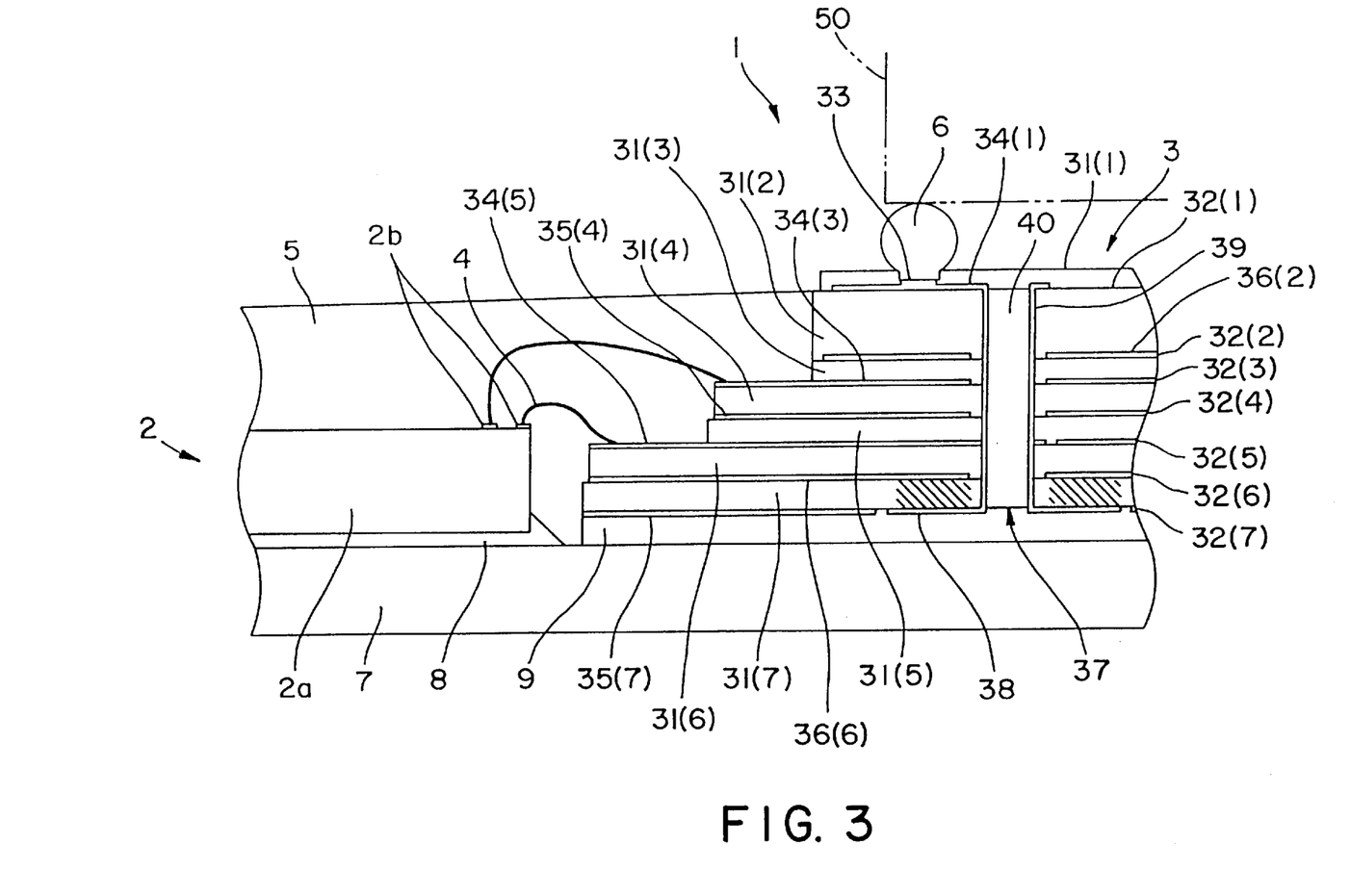
FIG. 3 is a partial sectional view schematically showing the internal structure of the semiconductor device according to the first embodiment.

Referring now to FIGS. 2 and 3, there is shown a semiconductor device of first embodiment according to the present invention wherein a capacitor is formed between through hole land 38 and ground line 36(6) disposed opposite to through hole land 38 and having a fixed electrical potential to adjust the impedance of signal wiring 34 connected to through hole land 38.

Referring to FIG. 2A to FIG. 2C, and FIG. 3 semiconductor device 1 of this embodiment is of BGA type in which solder balls 6 are arranged in grid form on its mounting surface. Semiconductor device 1 comprises semiconductor chip 2, package substrate 3, wiring 4, resin portion 5, solder balls 6, and heat spreader 7. Semiconductor chip 2 having a large number of circuit elements 2a of various types (only one of them is shown in FIG. 3) formed thereon is mounted on package substrate 3. Package substrate 3 has a rectangular opening formed in its central portion in which semiconductor chip 2 is placed. Package substrate 3 and semiconductor chip 2 are supported by heat spreader 7 disposed on their back.

Package substrate 3 and semiconductor chip 2 are fixed to heat spreader 7 by adhesive layers 8 and 9.

Package substrate 3 has wiring layers 32 on its surface and interior in which one of signal wiring 34, electric power line 35 and ground line 36 is formed on each of wiring layers 32. Signal wiring 34, electric power line 35 and ground line 36 are hereinafter collectively referred to as "wirings". The wiring (signal wiring 34, power line 35 or ground line 36) is connected to one of mounting terminals 33 on the front of package substrate 3. Placed on mounting terminal 33 is solder ball 6 serving as an outer bump for connection to another circuit 50. Terminal 2b on a surface of semiconductor chip 2 is electrically connected to one of the wirings (signal wiring 34, electric power line 35 or ground line 36) through bonding wire 4. Semiconductor chip 2 and bonding wire 4 are protected by resin portion 5.

Since the main features of semiconductor device 1 of this embodiment resides in package substrate 3, description is made primarily for package substrate 3.

Package substrate 3 has a multi-layer in which a plurality of wiring layers 32 are formed with insulator layer 31 sandwiched therebetween on the surface and in the inside of package substrate 3. In the following description, when each of wiring layers 32 needs to be specified, the wiring layer to be specified is designated with the number representing its layer position. For example, the wiring layer disposed closest to the front surface (upper side in FIG. 3) is designated as "wiring layer 32(1)", and the wiring layer disposed at the second closest position to the front surface as "wiring layer 32(2)". Similarly in insulator layer 31, the insulator layer is designated with the number representing its layer position from the front surface. For example, the insulator layer disposed between wiring layer 32(1) and wiring layer 32(2) is designated as insulator layer 31(2). The wirings (signal wiring 34, electric power line 35 and ground line 36) are designated similarly. In the figures, the reference numerals are given in such a manner.

Each of wiring layers 32 has one of signal wiring 34 for input and output of data signals or the like, electric power line 35, and ground line 36. Electric power line 35 and ground line 36 are fixed electrical potential conductor. In the embodiment, wiring layer 32(1) has signal wiring 34(1). Similarly, wiring layer 32(2) has ground line 36(2), wiring layer 32(3) signal wiring 34(3), wiring layer 32(4) power line 35(4), wiring layer 32(5) signal wiring 34(5), wiring layer 32(6) ground line 36(6), and wiring layer 32(7) power line 35(7), respectively.

Signal wiring 34 is formed in a predetermined pattern such that the length between the pad portion to which bonding wire 4 is connected and solder ball 6 is as uniform and short as possible over the entire semiconductor device 1. In contrast, electric power line 35 and ground line 36 are formed in a plane or mesh configuration over the entire surfaces of the wiring layers in which they are provided. Ground line 36(6) forming part of the capacitor together with through hole land 38, described later, is formed in a plane configuration over the entire surface of wiring layer 32(6). As shown in FIG. 3, in order to prevent the signal wirings from affecting each other, the wiring layer with a fixed electrical potential (electric power line 35 or ground line 36) is provided in the wiring layers adjacent to the wiring layer provided with signal wiring 34. For example, signal wiring 34(3) is disposed between ground line 36(2) and electric power line 35(4).

Insulator layers 31 serves to insulate the wirings in respective wiring layers 32, and their thickness, materials (dielectric constant) and the like are determined in consideration of the characteristics of the wiring in each of wiring layers 32. Insulator layer 31(1) disposed closest to the front surface consists of an applied solder resist.

Though holes 37 having through hole wire 39 on their inside wall are formed at some positions in package substrate 3. The connection between different wiring layers is made via through hole wire 39. A resin is filled into the portion within through hole 37 that is not occupied by through hole wire 39 to form filled resin portion 40.

Wiring layer 32(7) placed closest to the back surface (lower side in FIG. 3) has through hole land 38 formed thereon a position corresponding to through hole 37 for electrical conduction to through hole wire 39, in addition to the aforementioned electric power line 35(7). Through hole land 38 is formed such that it surrounds the opening of through hole 37 when viewed from the direction perpendicular to package substrate 3 (the vertical direction in FIG. 3). Typically, through hole wire 39 is separated from the wirings not connected thereto for insulation with a predetermined interval maintained therebetween. However, through hole land 38 of the embodiment extends beyond the interval and has a portion opposite to ground line 36(6) with insulator layer 31(7) interposed therebetween. In the portion opposite to ground line 36(6) (the hatched portion in FIG. 3), the capacitor is formed between through hole land 38 and ground line 36(6). The size of through hole land 38 is determined in accordance with a required magnitude of capacitance. The shape of through hole land 38 is not particularly limited. In the embodiment, the thickness of insulator layer 31(7) will be 150 μm.

Semiconductor device 1 of this embodiment can be manufactured through manufacturing steps substantially similar to those in the prior art.

Next, the operation of the semiconductor device will be described with reference to FIG. 3.

Various types of data signals, control signals and the like are input/output through signal wiring 34. Signal wiring 34 needs to have a low impedance since signals at a high frequency are input and output. In this embodiment, the capacitor formed between through hole land 38 and ground line 36(6) serves as a stub to reduce the impedance of the wiring connected thereto. For example, when the capacitor has a capacitance of 0.5 pF, the reactance for a signal at 400 MHz is 800 n, which value enables a reduction of approximately 5% in characteristic impedance (several tens of Ω) of a signal wiring in a typical organic multi-layer substrate.

In this case, since ground line 36(6) is formed in a plane configuration, almost all of each through hole land 38 can be utilized for a capacitor. Since through hole land 38 is formed on wiring layer 32(7) disposed on the outermost side (back side in this embodiment) of the wiring layers, an increase in size of through hole land 38 is unlikely to hinder the provision of signal wiring 34 and the like. Additionally, it is easy to appropriately change the size of through hole land 38 depending on the operating frequency of mounted semiconductor chip 2 or the like.

It is also contemplated that the capacitor is form ed by using the through hole land o n the side on which solder ball 6 is disposed (upper side in FIG. 3). However, wiring layer 32(1) has the wiring connected to solder ball 6, and the presence of that wiring serves as an obstacle which makes it difficult to increase the size of the through hole land. Therefore, the capacitor is preferably formed using through hole land 38 in wiring layer 32(7) opposite to the side on which solder ball 6 is provided.

As described above, the package substrate of this embodiment allows a reduction in impedance. Not only the impedance is low, but also magnitude of the capacitance of the capacitor, i.e., the magnitude of the impedance can be changed easily by a simple change in size of the through hole land readily allows a change in , and moreover, the impedance can be changed over a wide range. In addition, a change in size or shape of the through hole land has little influence on the other circuit portions. Therefore, the impedance matching is easily achieved for various circuits (semiconductor chip in this example). In the semiconductor device of this embodiment including such a package substrate, it is easy to match the impedance between the semiconductor chip and the package substrate. Therefore, circuit element 2a (semiconductor chip 2) can be operated at high speed by taking advantage of its inherent performance.

The impedance of the package substrate of the aforementioned embodiment depends on the magnitude (capacitance) of the capacitor. The capacitance can be adjusted (increased or reduced) by changing the area of opposite portion of the electrodes (conductors) forming the capacitor, the interval between the wiring layers (the thickness of the insulator layer), or the insulator material (dielectric constant). Description is hereinafter made for a few specific methods for adjusting capacitance.

Figure 4:
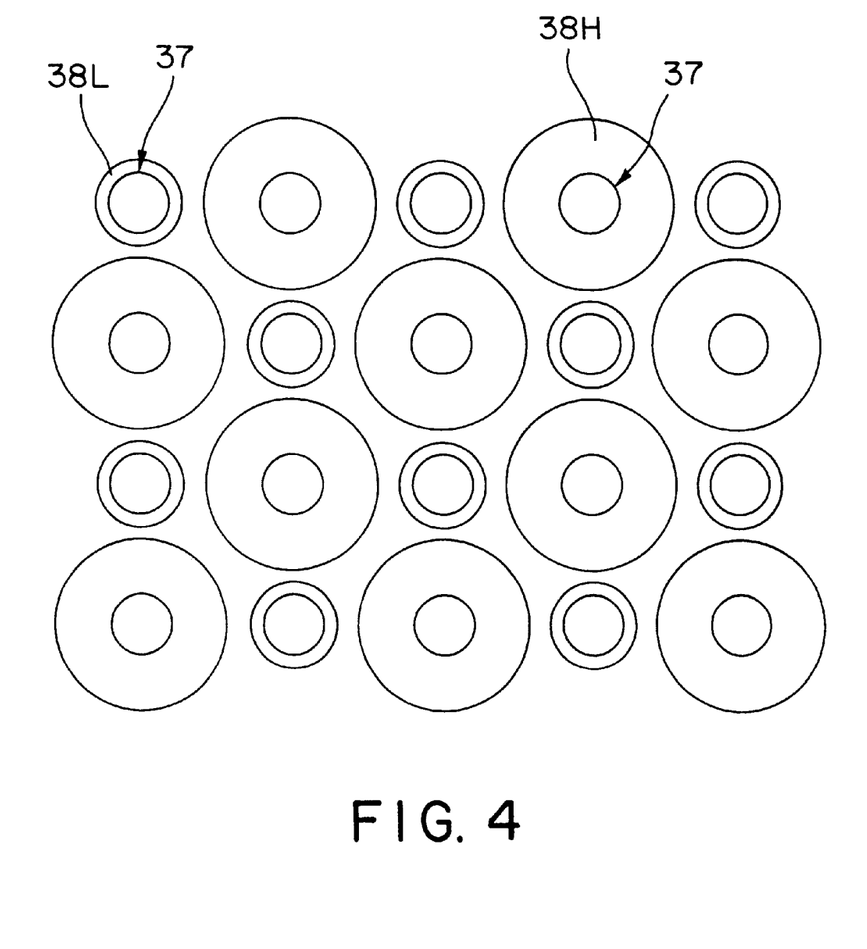
FIG. 4 is a diagram showing an exemplary arrangement of through hole lands with different sizes.

The size and shape of through hole land 38 may be changed in accordance with the frequency of signals input/output through the wiring connected to the through hole land (capacitor). In general, the impedance of a wiring needs to be reduced further as the frequency of signals input/output through the wiring is higher. Also, signals at the same frequency are not necessarily input to or output from all the wirings provided on one semiconductor device. Therefore, the area of a through hole land connected to a wiring for input/output of signals at a higher frequency, i.e. a wiring requiring a lower impedance may be more larger. For example, as shown in FIG. 4, in the case of through hole land 38H connected to signal wiring 34 for input/output of signals at a higher frequency and through hole land 38L connected to a wiring (including electric power line 35 and ground line 36) for input/output of signals at a lower frequency, the former is made larger and the latter is made smaller than the former. In this case, if only one of them is made larger than the prior art, sufficient insulation between through hole land 38H and through hole land 38L may not be obtained. To avoid this, through hole land 38H is preferably made larger than the conventional dimension (when the through holes have a 1.27 mm pitch, the outside diameter of the through hole land is Ø=0.55 mm), while through hole land 38L is made smaller than the conventional dimension. This makes it possible to effectively utilize a limited area in which the through hole land can be provided to thereby provide more effective impedance matching. In addition, little influence is exerted upon the other signal wirings. While the through hole lands have two sizes in the example shown in FIG. 4, they may have more sizes.

Additionally, in this case, if through hole lands 38H wherever possible (for example, both through hole lands are alternately disposed) as shown in FIG. 4, an increased area for the through hole lands can be obtained without forming the through hole land itself in extremely distorted shape. For example, if the through holes are formed with a 1.27 mm pitch, and through hole lands 38L and through hole lands 38H are alternately arranged as shown in FIG. 4, the area can be increased up to approximately three times larger than the conventional area even with the shape of the through hole lands maintained in circular form. If the shape of the through hole land is changed to occupy the area where the through hole lands are not provided, an additional increase in area can be obtained.

It is also possible to adjust the area over which through hole land 38 is opposite to ground line 36(6), i.e., the capacitance by reducing the diameter of through hole 37. For example, when the inside diameter of the through hole is changed to φ=0.2 mm with the outside diameter of the through hole land maintained at 0.55 mm as conventional, the opposed area is approximately twice the conventional area.

The capacitance can be increased by forming insulator layer 31(6) constituting part of the capacitor with a material having a higher dielectric constant than before. In this case, the dielectric constant of the insulator layer is related to the design of the wirings in the other layers. Therefore, the impedance can be reduced while the conventional design is followed without change even if the other insulator layers 31(1), (2), (3), (4) and (5) employ materials having a dielectric constant (4 to 5) similar to the conventional one.

From the viewpoint of improvement in wiring density, it is desirable that the dielectric constant of the insulator layer is low. On the other hand, for reducing the impedance with the aforementioned method of the embodiment, it is desirable the dielectric constant of insulator layer 31(7) forming the capacitor is high. In view of this, it is desirable that, of all insulator layers 31 included in package substrate 3, the aforementioned insulator layer 31(7) forming the capacitor is formed to have the highest dielectric constant while the other insulator layers 31(1), (2), (3), (4), (5) and (6) are formed to have the dielectric constants equal to or lower than the conventional one. This makes it possible to improve (or at least maintain) the wiring density and to reduce the impedance simultaneously.

Materials usable for forming the insulator layer with a dielectric constant equal to the conventional one include MCL-E-679 (product name: dielectric constant=4.2 (measured at 1 GHz) to 4.8 (measured at 1 MHz) made by Hitachi Chemical Co., Ltd, for example. On the other hand, materials which can form the insulator layer with a dielectric constant higher than the conventional one include MCL-HD-67 (product name; dielectric constant 10.0 (measured at 1 GHz) to 10.6 (measured at 1 MHz)), for example.

A reduction in thickness of the insulator layer forming the capacitor allows a greater capacitance, i.e. a further reduction in impedance. While a thickness of insulator layer 31(7) is 150 μm in the aforementioned embodiment, the thickness may be further reduced. In this case, if the thickness of the semiconductor device needs to be equal to a conventional thickness for the sake of mounting, an additional layer may be provided for adjusting the thickness of the entire device. Alternatively, heat spreader 7 may be thickened.

In the aforementioned embodiment, the capacitor is formed by utilizing through hole land 38 provided in wiring layer 32(7) disposed on the outermost side of the wiring layers. However, an element usable for forming the capacitor is not limited to the so-called through hole land. A conductor portion (conductor portion in outermost wiring layer) opposite to ground line layer 36(6) and forming the capacitor may be additionally provided at any position in wiring layer 32(7) disposed on the outermost side of the wiring layers such that the conductor portion is connected to through hole wire 39 or to signal wiring 34.

In the aforementioned embodiment, the capacitor is formed by using the though hole land provided in the outermost layer of package substrate 3. However, the capacitor may be formed with the conductor wiring provided inside package substrate 3 and the ground line layer (or electric power layer). In consideration of other wirings, the use of the conductor (particularly through hole land 38) formed in wiring layer 32(7) disposed on the outermost side of the wiring layers is the simplest way to form the capacitor and is capable of increasing the area (capacitance).

While the capacitor is comprised of the ground line and the through hole land (conductor portion in outermost wiring layer) in the aforementioned embodiment, the construction of the capacitor is not limited thereto. The capacitor may be comprised of the electric power line and the though hole land (conductor in outermost wiring layer). Additionally, the capacitor may be comprised of the through hole land (conductor portion in outermost wiring layer) and the wiring (conductor portion) other than the electric power line and ground line if it has a fixed electric potential.

The arrangement of signal wiring 34, power line 35, and ground line 36 in package substrate 3 is not limited to the example shown in the aforementioned embodiment, and can be appropriately changed as required. The number of the laminated wiring layers is also not limited to seven.

In the aforementioned embodiment, the semiconductor chip is connected to the wirings provided in package substrate 3 by wire bonding. However, the connection of them is not limited thereto, and any other connection methods (for example, flip chip method) may be used.

While a preferred embodiment of the present invention has been described using specific terms, such description is for illustrative purposes only, and it is to be understood that changes and variations may be made without departing from the spirit or scope of the following claims.

What is claimed is:

1. A package substrate comprising:
    a plurality of mounting terminals for mounting to an external device;
    a plurality of signal wirings, said each signal wiring for connecting a terminal of a semiconductor chip to said each mounting terminal;
    a fixed electric potential conductor, its electrical potential being maintained constant when mounted on said external device; and
    one or more opposed conductors each connected to any of said signal wirings and being opposite to said fixed electrical potential conductor with insulation from said fixed electrical potential conductor being maintained, wherein said mounting terminals, said signal wiring, said opposed conductor, and said fixed electrical potential conductor are formed on one of a plurality of wiring surfaces laminated in parallel with insulating layers therebetween; and
    said opposed conductor is placed on the wiring surface on the outermost side of said plurality of wiring surfaces, wherein the insulating layer formed between said opposed conductor and fixed electric potential conductor has a dielectric constant higher than that of the other insulating layers.

2. The package substrate according to claim 1, wherein said opposed conductor is arranged on the wiring surface different from the wiring surface on which said mounting terminals are arranged.

3. The package substrate according to claim 1, further comprising:
    a through hole formed in said insulating layers; and
    a through hole wire formed in said through hole;
    wherein said signal wiring and said opposed conductor connected thereto are connected through said through hole wire.

4. The package substrate according to claim 3, wherein said opposed conductor is arranged around said through hole with said through hole wiring connected to said opposed conductor.

5. The package substrate according to claim 4, wherein said opposed conductor is a through hole land.

6. The package substrate according to claim 5, wherein said through holes have a pitch of 1.27 mm,
    said opposed conductor connected to said signal wiring for input/output of a signal at a certain frequency is of circular shape with an outside diameter of 0.55 mm or more, and
    said opposed conductor connected to said signal wiring for input/output of a signal at a lower frequency than said certain frequency is of circular shape with an outside diameter of 0.55 mm or less.

7. The package substrate according to claim 6, wherein said through hole has an inside diameter of 0.2 mm or less.

8. The package substrate according to claim 3, wherein said insulator layer formed between said wiring surface of said plurality of insulator layers, with said opposed conductor and said wiring surface with said fixed electric potential conductor opposite to said opposed conductor has the highest dielectric constant of a plurality of said insulator layers.

9. The package substrate according to claim 3, wherein said insulator layer formed between said opposed conductor and said fixed electric potential conductor has a thickness of 150 μm or less.

10. The package substrate according to claim 1, wherein the higher the frequency of a signal input to or output from said signal wiring connected to said opposed conductor, the larger said opposed conductor size.

11. The package substrate according to claim 10, wherein said opposed conductor connected to said signal wiring for input/output of a signal at a certain frequency and said opposed conductor connected to said signal wiring for input/output of a signal at a lower frequency than said certain frequency are alternately arranged.

12. The package substrate according to claim 1, wherein said fixed electrical potential conductor is formed in a plane configuration extending substantially over the entire surface of said wiring surface with said fixed electrical potential conductor.

13. A semiconductor device comprising:

a package substrate comprising a plurality of mounting terminals for mounting to an external device, a plurality of signal wirings, said each signal wiring for connecting a terminal of a semiconductor chip to said each mounting terminal, a fixed electric potential conductor, its electrical potential being maintained constant when mounted on said external device, and one or more opposed conductors each connected to any of said signal wirings and being opposite to said fixed electrical potential conductor with insulation from said fixed electrical potential conductor being maintained, wherein said mounting terminals, said signal wiring, said opposed conductor, and said fixed electrical potential conductor are formed on one of a plurality of wiring surfaces laminated in parallel with insulating layers therebetween; and said opposed conductor is placed on the wiring surface on the outermost side of said plurality of wiring surfaces, wherein the insulating layer formed between said opposed conductor and fixed electric potential conductor has a dielectric constant higher than that of the other insulating layers; and a semiconductor chip having circuit elements and terminals formed thereon and mounted in said package substrate such that said terminals are connected to said signal wiring of said package substrate.

* * * * *